United States Patent [19]

Scharlack et al.

[11] 4,239,555
[45] Dec. 16, 1980

[54] ENCAPSULATED SOLAR CELL ARRAY

[75] Inventors: Ronald S. Scharlack, Brookline; Eric Tornstrom, Acton, both of Mass.

[73] Assignee: Mobil Tyco Solar Energy Corporation, Waltham, Mass.

[21] Appl. No.: 61,634

[22] Filed: Jul. 30, 1979

[51] Int. Cl.³ .......................................... H01L 31/04
[52] U.S. Cl. ................................. 136/251; 156/104;
156/105; 156/285; 156/286; 264/272; 250/239;
250/239
[58] Field of Search ................. 136/89 EP; 89 CA;
156/104, 105, 285, 286, 305; 357/72; 264/272

[56] References Cited

U.S. PATENT DOCUMENTS

| | | | |
|---|---|---|---|
| 4,061,522 | 12/1977 | Bauerkemper | 156/305 |
| 4,097,308 | 6/1978 | Klein et al. | 136/89 H |
| 4,167,644 | 9/1979 | Kurth et al. | 136/89 EP |

FOREIGN PATENT DOCUMENTS

| | | | |
|---|---|---|---|
| 685400 | 4/1964 | Canada | 136/89 CA |
| 2757765 | 2/1979 | Fed. Rep. of Germany | 136/89 EP |
| 1023847 | 3/1966 | United Kingdom | 136/89 EP |

*Primary Examiner*—Aaron Weisstuch
*Attorney, Agent, or Firm*—Schiller & Pandiscio

[57] ABSTRACT

Solar cell array and method for manufacturing same wherein the individual cells of the array are sandwiched and held resiliently captive between and electrically isolated from a transparent protective front cover and a protective rear substrate by an encapsulating transparent silicone elastomer cast in situ in the interstices between the cover, the cells, and the substrate, the elastomer being introduced, while fluid, into the sandwich through the same terminals used for the electrical connection of the array to its electrical load.

7 Claims, 5 Drawing Figures

ENCAPSULATED SOLAR CELL ARRAY

BACKGROUND OF THE INVENTION

This invention relates to the manufacture and construction of solar cell panels, and more particularly, to the encapsulation of solar cells interconnected in a multi-cell array.

Solar cell panels for directly converting radiant energy from the sun into electrical energy are well known. In order to support and protect the array of cells interconnected to form such a panel, common practice has been to laminate the array between preformed layers of silicone or other polymers backed by rigid glass or plastic sheets. The laminated sandwich so formed provides not only mechanical support for the array of cells, but also protects the cells from environmental degradation. The sandwich so formed is also useful in that it serves as a heat sink, conducting unwanted heat away from the cells.

A number of techniques have been commonly employed to improve the collection efficiency of solar cell arrays. Among these is the shingle-style interconnection of cells, wherein the electrical bus area on the face of one cell is disposed along an edge and is directly contacted to the bus on the rear of the next cell, in order to maximize the photosensitive area per unit area of panel in a series connected cell array. Because of the periodically varying thickness of such an array, it is not easily incorporated into a laminated structure, however. Not only may this result in inadequate encapsulation, with the attendant risk of environmental degradation of the poorly sealed-off cells, but also it should be noted that any voids between the cells and the front cover may result in a loss of efficiency due to reflection at the interfaces of the voids with the surrounding media. These voids will also lead to the poorer conduction of heat away from the cells.

Further, it should be noted that common assembly techniques often feature the rigid mounting of the cells of the array to a rigid substrate. Not only does this expose the cells to potential damage from mechanical shock transmitted through the substrate, but also places limitations on the size of tightly packed arrays if the stresses due to differential expansion between the array and the substrate are to be minimized.

Accordingly, one of the objects of the present invention is to provide an encapulated shingle-style solar cell array which is simple to fabricate and which does not contain deleterious voids, and which provides a resilient mounting of the cells, thereby minimizing mechanical and thermal problems.

SUMMARY OF THE INVENTION

This and other objects are met by the solar panel of the present invention in which an array of solar cells, arranged shingle-style, is sandwiched and held resiliently captive between a transparent protective front cover and a protective rear substrate by an encapsulating transparent silicone elastomer cast in situ in the interstices between the cover, the cells and the substrate. In fabricating the panel in accordance with the preferred forms of the invention, the cells are first interconnected, electrically and mechanically, with an expanded metallic mesh, and then aligned on the substrate. Hollow electrical terminals, for connecting the array with its load, pass through the substrate and are connected to the expanded metallic mesh. A spacer, in the form of a peripheral bead of polyisobutylene butyl, is placed on the substrate and the front cover placed on this. The resulting sandwich is held closed by channels in a peripheral supporting frame, and fluid elastomer is introduced into the sandwich through the hollow electrical termainals. The expanded metallic mesh is so selected as to be sufficiently flexible and open to permit the fluid elastomer to thoroughly penetrate the interior of the assembly.

It will be appreciated that, since the encapsulating elastomer is case in situ, the difficulties attendant upon protecting the solar cells by laminating the array between layers of a pre-formed transparent elastomer are largely avoided. The encapsulation of solar cell arrays having varying thickness can be accomplished virtually free of voids. Consequently, solar panels made in accordance with the principles of the present invention may readily accommodate shingle-style cell arrays, thereby utilizing the panel area highly efficiently, while still providing a high degree of environmental protection to the cells and good optical coupling between the cells and the panel cover, due to the lack of voids between the cells and the cover. While not an ideal heat conductor, the silicone encapsulant is less of a thermal barrier than air, and therefore this design also leads to reasonably good conduction of unwanted heat away from the solar cells. The flexible interconnection of the cells by the expanded metallic mesh and the attachment of the cells to the substrate by an elastomer protects the cells from both mechanical shock and thermal expansion induced stresses.

Other objects, features, and advantages of the present invention will in part appear obvious and will in part appear hereinafter. The invention accordingly comprises the apparatus and method exemplified in the following detailed disclosure, the novel features of which are set forth in the appended claims.

BRIEF DESCRIPTION OF THE DRAWINGS

For a fuller understanding of the nature and objects of the present invention, reference should be had to the following detailed description taken in connection with the accompanying drawings wherein.

DETAILED DESCRIPTION OF THE DRAWINGS

Figure 1:
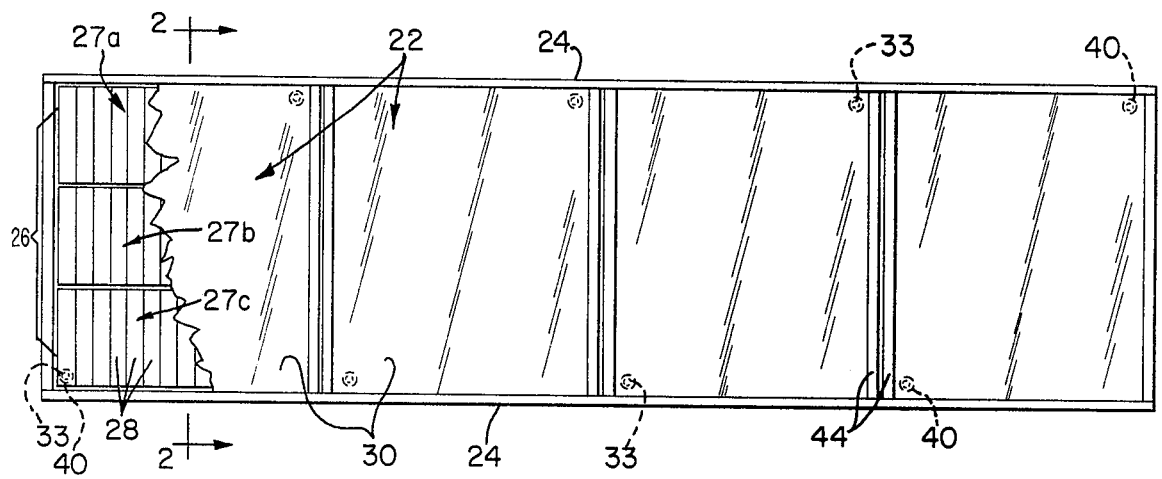
FIG. 1 is a plan view, from the front, of a preferred form of solar panel made according to the present invention, with the front cover partially broken away to reveal the arrangement of a solar cell array.

Referring to FIG. 1, there may be seen an apparatus made in accordance with the principles of the present invention which, in a preferred embodiment, is in the form of a substantially rectangular solar panel comprised of a plurality of substantially square modular panels 22 assembled on longitudinal support frames 24.

Figure 2:
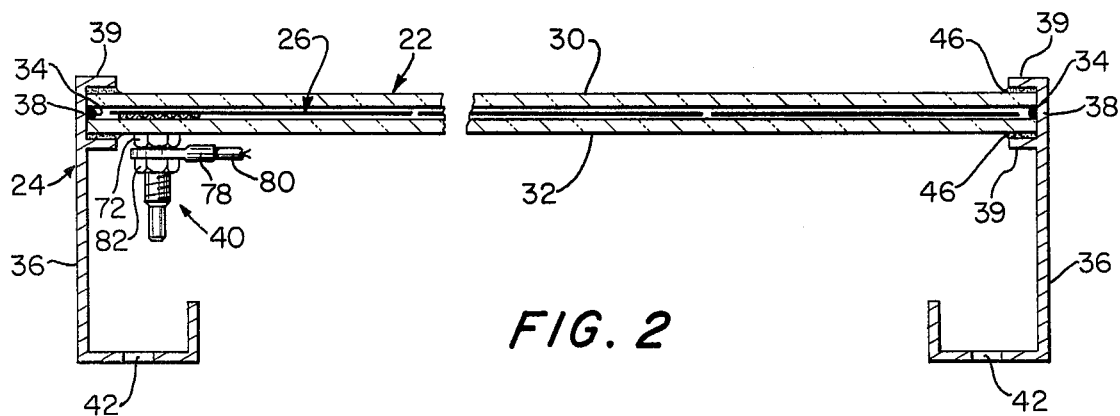
FIG. 2 is a cross-sectional view of the same panel taken along the line 2—2 of FIG. 1.

Each modular panel 22 contains a thin, substantially square array 26 of photovoltaic solar cells 28, arranged in rows 27 a–c, and provided with a transparent protective front cover 30 and, as may be seen by reference to FIG. 2, a supporting protective rear cover 32. Front cover 30 and rear cover 32 are both substantially flat thin square sheets of equal expanse, so dimensioned as to be slightly larger than the area occupied by array 26. In the preferred embodiment, both covers are fabricated from glass sheet, front cover 30 being of ASG Sunadex glass and rear cover 32 being of ASG floatglass, although it will be understood that other materials could be used, provided they possess the requisite optical, mechanical and electrical properties, e.g. a polycarbonate or polyacrylate. Glass was chosen as the preferred cover material because it provides a hermetic barrier to environmental agents which tend to degrade the performance of solar cells, and further because it has an inherently low coefficient of thermal expansion, provides excellent electrical isolation, and is low in cost. ASG Sunadex was selected for front cover 30 due to considerations of its transmissivity. For a modular panel 22 one foot (0.3 meter) square, glass ⅛ inch (3 mm) thick was found adequate for front cover 30 and glass 3/32 inch (2.4 mm) thick was found adequate for rear cover 32. Each rear cover 32 is provided with a pair of circular holes 33, of a diameter to accomodate terminals 40 which preferably are located near diagonally opposite corners of panel 22 and sufficiently clear of the edges of the cover to permit assembly, as will be described. A bead 34 of sealant, which in a preferred embodiment is polyisobutylene butyl (available as Tremco 750-55X, Inmont 176.6, or the like) forms a resilient peripheral gasket and spacer between covers 30 and 32. Bead 34 is so disposed and dimensioned as to lie wholly between covers 30 and 32, peripherally about their edges, and wholly outboard of and completely surrounding array 26. Bead 34 is considerably thicker than array 26, being on the order of 1/16 (1.5 mm) in thickness by ¼ inch (6 mm) wide.

Also shown in FIG. 2 are support frames 24 which, as may be seen, have the form of a J-shaped section 36 surmounted by an on-edge channel section 38. In a preferred embodiment support frames 24 are formed of 1/32 inch (0.79 mm) thick anodized aluminum extrusions, although it will be obvious that other dimensions, materials, and methods of fabrication may be employed, provided the necessary mechanical strength is assured. The inside dimensions of channel section 38 are chosen so as to loosely accommodate the assembled covers 30 and 32 and bead 34. The inside dimensions of J-shaped sections 36 are chosen to provide clearance for terminals 40 and to facilitate mounting the entire assembly to whatever structure it is desired to mount it to, as by bolts through bolt holes 42. The overall length of each support frame 24 is chosen to accommodate a number of individual panels 22.

Each panel 22 is also provided with a pair of end caps 44, as may be seen by reference to FIG. 1. End caps 44 are fashioned from channel sections of similar structure and inside dimensions as the channel sections 38 of support frames 24. Each end cap 44 is dimensioned to have an overall length somewhat smaller than the width of an individual panel 22 less twice the depth of the lips 39 (FIG. 2) of a channel section 38.

Figure 5:
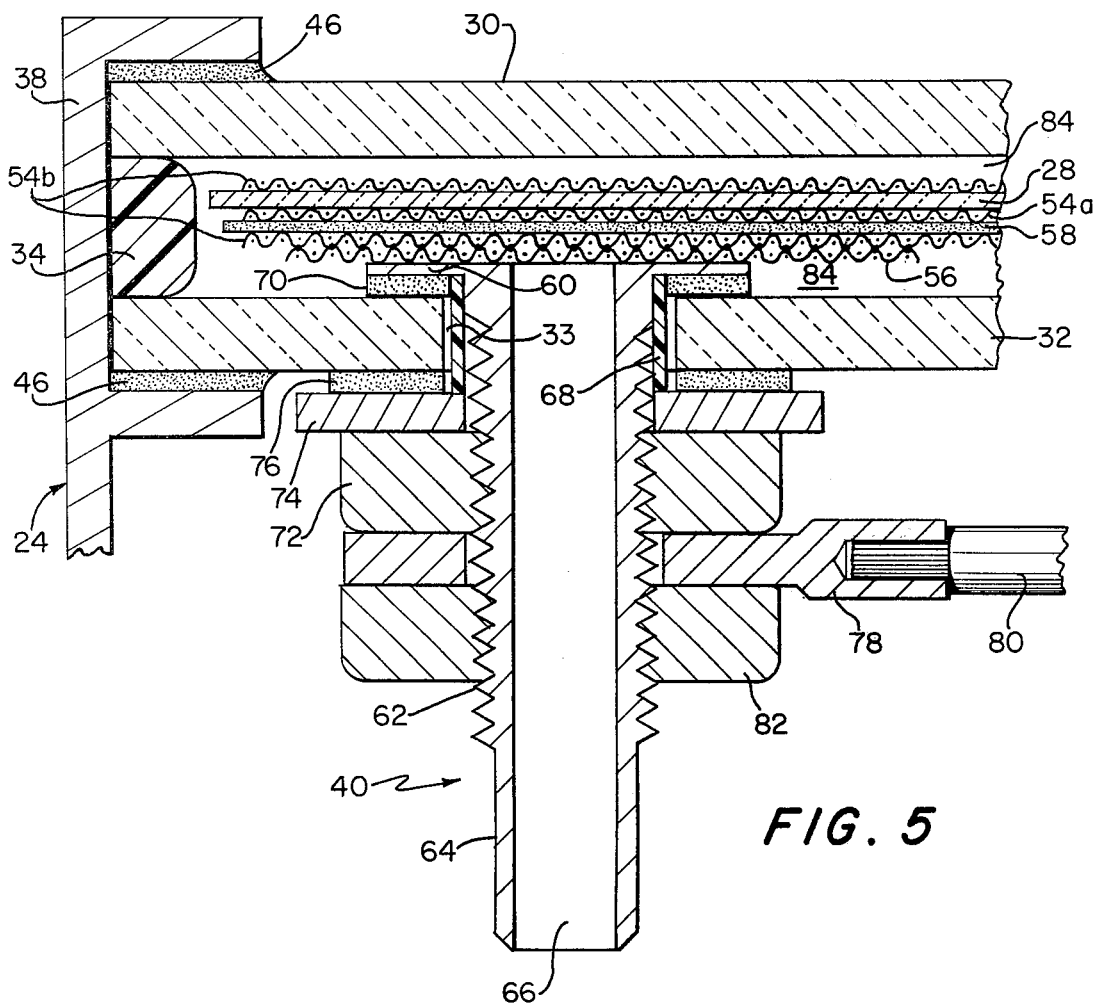
FIG. 5 is an enlarged fragmentary longitudinal sectional view, illustrating details of the electrical terminal shown in FIG. 2.

Front cover 30 and rear cover 32 are sealed to the channel sections of support frame 24 and end caps 44 by calking 46, as may be seen by reference to FIGS. 2 and 5. Calking 46 may be any of a number of commonly employed sealants which are used to provide a bond between glass and aluminum and to provide a water barrier; GE IGS 3100 silicone sealant has been found satisfactory.

Figure 4:
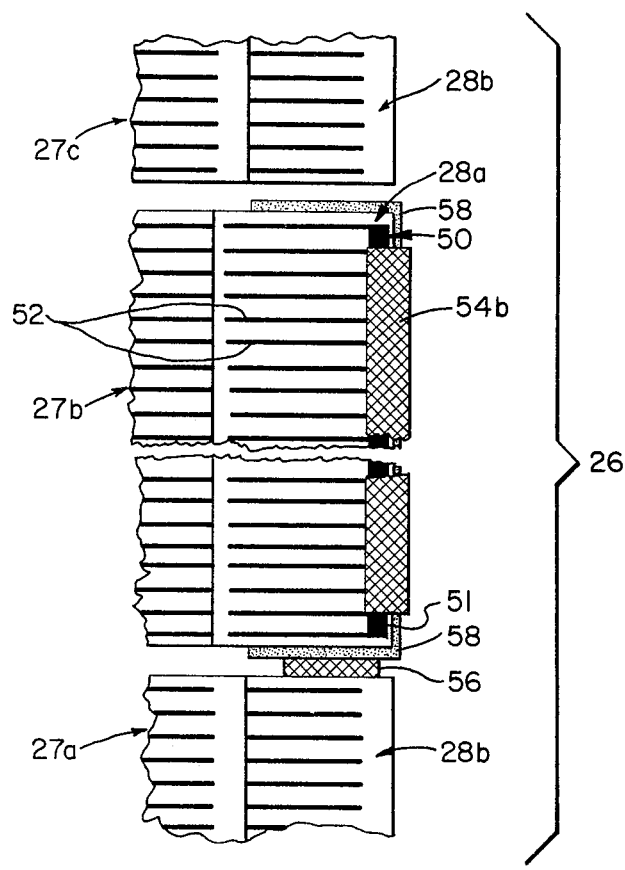
FIG. 4 is a detailed fragmentary plan view, from the front, of a portion of the solar cell array shown in FIG. 1.
Figure 3:
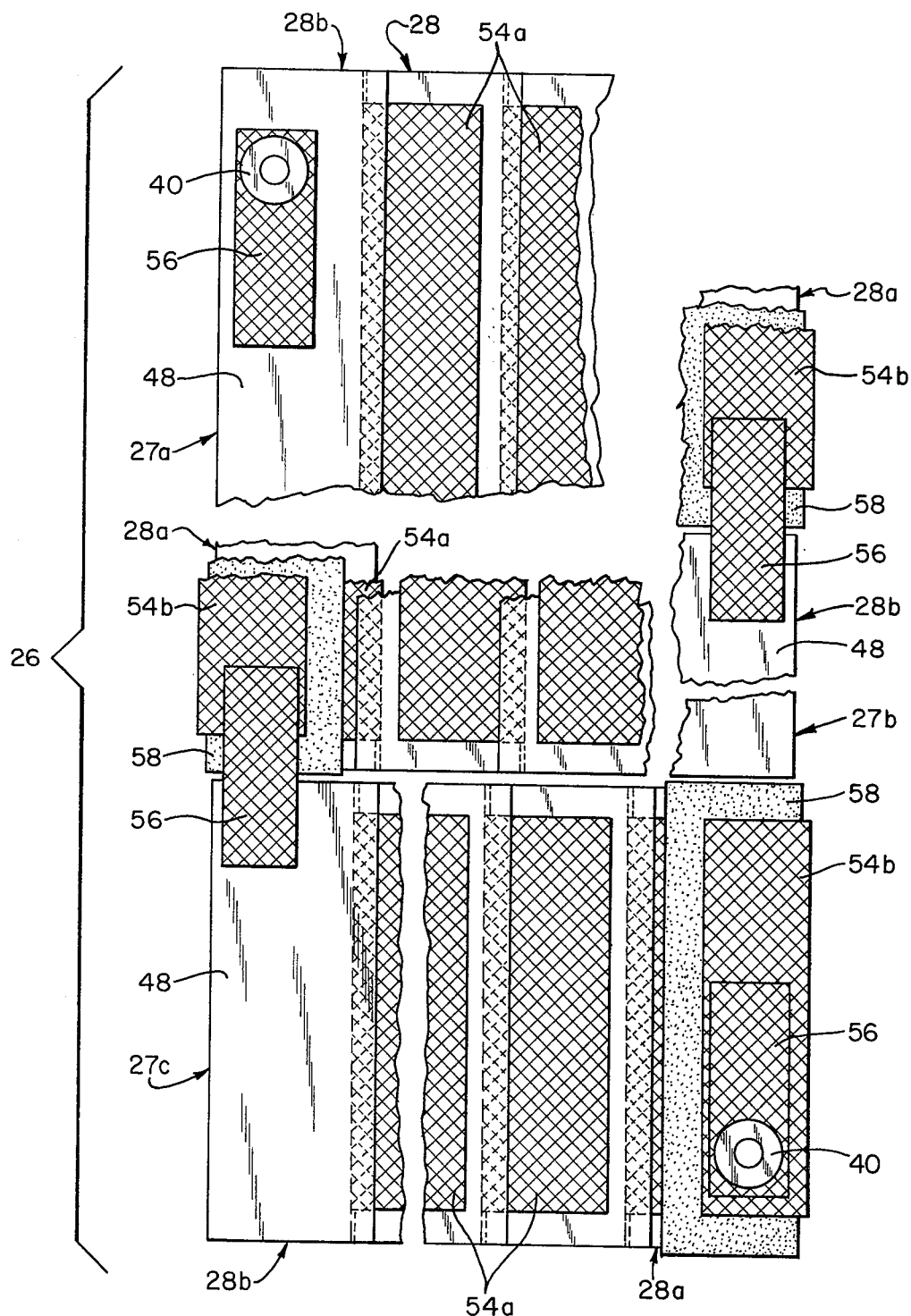
FIG. 3 is a detailed fragmentary plan view, from the rear, of a portion of the solar cell array shown in FIG. 1.

Turning now to FIG. 3, there may be seen a fragmentary rear view of a portion of a solar cell array 26 of ribbon-shaped photovoltaic solar cells 28. Solar cells 28 may be silicon cells formed from ribbon grown by the edge-defined film-fed growth technique and finished by conventional diffusion and metallization techniques. In a preferred embodiment, the cells are each nominally 2.5 cm wide by 0.025 cm thick by 10 cm long. Each solar cell 28 is provided with a rear electrode 48 in the form of a metallized coating which covers substantially the entire rear surface of the cell. Each cell 28 is also provided with a front electrode 50 that comprises a bus 51, in the form of a narrow metallized strip disposed along a long edge of the front surface of the cell, as may be seen in FIG. 4. Front electrode 50 also includes a grid of conductors 52 which are electrically interconnected with bus 51. Conductors 52 have the form of thin metallized strips disposed in substantially parallel columns transversely crossing the front surface of cell 28. Both front and rear electrodes 50 and 48 may be solder plated to facilitate the electrical interconnection of a number of cells. The front surfaces of solar cells 28 are preferably anti-reflection coated with a material such as $Si_3N_4$ having an index of refraction between 2.0 and 2.5.

In a preferred embodiment, each array 26 is comprised of forty-five solar cells 28 connected in series and disposed in three rows 27 a–c of fifteen cells each. All of the solar cells within a row are disposed shingle-fashion with their front electrodes 50 oriented in the same direction and with the front bus 51 of each cell just covered by that portion of the rear electrode 48 of the next cell which is furthest from its own front bus. Each row of cells 28 electrically terminates in a rear electrode 48 at one end of the row 27 (at cell 28b) and a front electrode 50 at the other (at cell 28a). Adjacent rows in each panel 22 are arranged with their front busses 51 oriented in opposite directions, in order that the rows may be most readily series connected.

The actual mechanical and electrical connection between the front and rear electrodes of adjacent cells 28 in a row of cells is made by bus straps 54a, which may be best seen in FIG. 3. Similar bus straps 54b are attached to front electrodes 50 of end cells 28a in each row. Bus straps 54a and 54b are of expanded metallic mesh, such as expanded copper mesh (available as Exmet 3Cu6-3/0) cut into rectangular pieces each of which is slightly smaller than an individual cell 28 (i.e., on the order of 2 cm wide by 8 cm long). Each bus strap 54a and 54b is soldered to an individual bus 51 of a front electrode 50 so as to extend along the length of the bus, substantially covering it while leaving the remaining portion of the front surface of the cell unobscured. Bus straps 54a and 54b are identical except for the manner of their connection to rear electrodes 48. Each bus strap 54a is soldered to the rear electrode of the adjacent cell in the same row which is overlapped by the front bus 51 to which the strap is attached. Each bus strap 54b is bent over the edge of an end cell 28a so as to overlie, but not contact, the rear electrode and the attached strap 54a.

An insulator pad 58 is provided for each row 27 of cells. Insulator pads 58 serve to cover the rear of end cells 28a, separating and electrically insulating the rear electrode of the cell and the bus strap 54a soldered thereto from the folded-over bus strap 54b. Insulator pads 58 are substantially rectangular in plan, and may be cut from any of a number of sheet electrical insulating materials such as sheet silicone, so as to be wide as a cell 28 less the width of a front bus 50 and slightly longer than a cell 28 (i.e., on the order of 2 cm wide by 10 cm long).

Adjacent rows of cells are connected in series, and the array of cells is connected to terminals 40, by somewhat smaller (i.e., on the order of 1½ cm by 4 cm) tie straps 56. Tie straps 56 are cut from the same material as bus straps 54. The metallic mesh of straps 54 and 56 may be solder plated to facilitate the interconnection of components by reflow soldering. A tie strap is provided for each connection between rows 27 of cells and for the two electrical terminations of each array 26. Each tie strap 56 is so disposed as to electrically connect together either a bus strap 54b connected to an end cell 28a with a rear electrode 48 of an adjacent end cell 28b or the bus strap 54b at one end of the array and the rear electrode 48 at the other with their respective terminals 40.

Turning now to FIG. 5, there may be seen an enlarged sectional view of a portion of a modular panel taken through a terminal 40. Terminal 40 is in the form of a hollow bolt having a thin flat head 60, and a shank with a threaded portion 62 and a smooth cylindrical tip 64; each terminal is provided with a smooth axial bore 66 throughout. The diameter of terminal 40 is chosen primarily on the basis of electrical considerations, although it will be understood that it must be sufficient to provide a reasonably-sized axial bore in a reasonably mechanically sound bolt. Tip 64 is dimensioned so as to be somewhat smaller in outside diameter than the grooves of threaded portion 62 of the terminal, and head 60 is dimensioned so as to have a considerably greater outside diameter than that of the lands of threaded portion 62. Holes 33 in rear cover 32 are dimensioned to loosely accept threaded portion 62, together with a surrounding section of tubing 68, while not allowing the passage of head 60. Terminal 40 is disposed to extend through hole 33 of rear cover 32, with head 60 on that side of the rear cover which faces toward front cover 30. Head 60 is cemented to rear cover 32 by a bead 70 of flexible epoxy, which in a preferred embodiment is on the order of 1/32 inch (0.8 mm) thick. Terminal 40 is further secured to the rear cover by a nut 72, acting cooperatively with threaded portion 62, drawn up tight against a rigid washer 74 and a resilient washer 76. Rigid washer 74 has an inside diameter slightly greater than that of nut 72. Resilient washer 76 is of an elastically deformable material, such as silicone, and has an inside diameter on the order of that of hole 33 of rear cover 32. Resilient washer 76 has an outside diameter slightly smaller than that of rigid washer 76 and a thickness on the order of 1/32 inch (0.8 mm). Tubing 68 is dimensioned to fit, under slight axial compression, between rigid washer 74 and head 60, about terminal 40. To this end, tubing 68 has an inner diameter chosen to snugly fit about threaded portion 62 and an outer diameter chosen to loosely fit within hole 33 of rear cover 32. The length of tubing 68 is slightly greater than the combined thickness of epoxy bead 70, rear cover 32, and resilient washer 76. Tubing 68 is fabricated of polypropylene or similar elastically deformable polymer. A terminal lug 78, connecting to electrical cable 80, is secured to terminal 40 by a nut 82. In order to accommodate nuts 72 and 82 and lug 78, threaded portion 62 of terminal 40 is dimensioned to extend from head 60 a distance in excess of the combined thicknesses of bead 70, rear cover 32, washers 74 and 76, nuts 72 and 82, and lug 78. Tip 64 is dimensioned to accept flexible tubing, as will hereinafter be described. Terminal 40, washer 74, and nuts 72 and 82 are fabricated from brass or similar material, and may be solder plated to insure good electrical connection.

Also shown in FIG. 5 is a transparent encapsulant 84 which surrounds solar cells 28 and the associated bus straps 54 and insulating pads 58 and fills the otherwise unoccupied volume between front cover 30 and rear cover 32. In a preferred embodiment, encapsulant 84 is Dow Corning Sylgard 184 silicone elastomer, a two-part elastomer, which, when first compounded is fluid. This was chosen from other initially fluid elastomers because of its high transmissivity, refractive index (near that of glass), electrical insulating properties, and low elastic modulus, although it will be recognized that other elastomeric materials which have similar properties and which can be flowed into place may also be used.

The method of assembly of the solar panel will now be described. Individual modular panels 22 are assembled from pre-assembled arrays 26 of solar cells 28. Individual cells are connected together in rows by bus straps 54a, soldered to front and rear electrodes, and individual rows are connected by tie straps 56 and bus straps 54b. Each array is also provided with a pair of tie straps 56 soldered in place on the rear electrode 48 and the bus strap 54b which electrically terminate the array in order to form a pair of flexible terminal leads. It will be appreciated that although the preferred embodiment disclosed herein is a series connected shingle-style array, other configurations of solar cells may be encapsulated by the methods of the present invention.

Terminals 40 are affixed to rear covers 32 as follows. A bead 70 of flexible epoxy is formed about each hole 33 in rear cover 32 on one side of the rear cover. Tubing 68 is fitted about threaded portions 62 of each terminal 40, and the terminals and surrounding tubing are inserted through holes 33 such that the heads 60 of the terminals are cemented to rear cover 32 by beads 70. Each terminal 40 is further secured in place by a resilient washer 76, a rigid washer 74, and a nut 72, which also serve to hold tubing 68 captive.

Array 26 is now placed, with rear busses 48 facing down, on rear cover 32. The array is arranged, substantially centered on the rear cover, with edges substantially parallel to the edges of the cover and with the tie straps 56 which are connected respectively to the rear bus 48 and the folded-over bus strap 54b of the cells electrically terminating the array in contact with terminals 40. These tie straps are then soldered to the terminals. It will be appreciated that once a panel is fully assembled, disassembly for repair of a defective solar cell or electrical connection will be difficult, if not virtually impossible. Therefore, electrically testing the array at this point in the assembly is advisable.

A bead 34 of sealant approximately ⅛ inch (3 mm) in diameter is now deposited about the periphery of one surface of front cover 30, and front cover 30 is lowered, with the bead on the lowermost surface, onto rear cover 32, care being taken to insure registration of the edges of the two covers. Front and rear covers are now gently forced together, compressing head 34 to approximately 1/16 inch (1.5 mm) by ¼ inch (6 mm), thereby forming a tight seal surrounding array 26. This compressive force may be provided by weights or clamps, which may be used not only to insure a tight seal between bead 34 and covers 30 and 32, but also to restrain the covers during encapsulation.

Encapsulant 84 is now introduced into the sandwich formed by front and rear covers 30 and 32. The encapsulant, while still fluid, is forced into the sandwich through axial bore 66 of one of the terminals 40. This may be facilitated by coupling to terminal 40 a conduit connected to a mixing pump of the type commonly used in the injection molding of thermosetting plastics. To this end, such a conduit may be coupled by threading it into threaded portion 62 of the terminal. The expanded mesh structure of bus straps 54 and tie straps 56, and the flexibility of the connections between terminals 40 and array 26 and between the individual cells 28 of the array themselves, all contribute to allow the ready penetration of encapsulant 84 throughout the structure. This is also encouraged by the diagonal location of the other terminal 40 in the modular panel, which permits the thorough exhaustion of air, through its bore 66, as encapsulant is introduced through the bore of the first terminal. Encapsulant is forced into the modular panel through one terminal 40 until all the air is exhausted, as evidenced by encapsulant issuing from the other terminal 40. The procedure is repeated for each modular panel 22 of the set of modular panels making up rectangular panel 20.

The filled modular panels are allowed to remain relatively undisturbed while the encapsulant cures, and are then assembled into end caps 44 and support frames 24. First, the interiors of end caps 44 are partially filled with calking 46, the end caps are positioned on opposite edges of the modular panels 22, and the calking is allowed to harden. The same procedure is followed with support frames 24, the required number of modular panels 22 being positioned along a pair of support frames 24, the channel sections 38 of which have been partially filled with calking 46.

Completed modular panels 22 may be connected to their electrical load by cables 80 secured to terminals 40 by lugs 78 held between nuts 72 and 82.

The present invention has several advantages. In the first place, since the encapsulating elastomer is cast in situ, the difficulties attendant upon protecting the solar cell array by laminating the cells between layers of a pre-formed transparent elastomer are largely avoided, and the encapsulation of arrays having varying thicknesses can be easily accomplished in a way which insures the assembly to be virtually free of voids. Thus, such designs as shingle-style arrays, which efficiently use the available light collecting area, may be readily encapsulated, not only for the protection of the cells, but also to minimize reflection losses. The present invention further allows such encapsulation to be made between covers of relatively impervious material, such as glass, with minimal incursions through and, therefore, relatively little disruption of the integrity of the cover, thereby offering the cells superior protection from deleterious atmospheric contaminants. Of course only one of the terminals in each panel need be hollow as shown to permit introduction of encapsulant, since escape of air may be achieved through a hole in the bead 34. Finally, it should be noted that the flexibility of the leads and the resilience of the encapsulating elastomer results in an assembly which has a high degree of immunity to mechanical shock and the stresses due to differential thermal expansion.

It will be understood that the details and specific dimensions of the described embodiment are for the purposes of illustration only, and the invention is not to be construed as limiting except by the scope of the appended claims.

What we claim is:

1. In a solar panel sub-assembly comprising in combination:
   an array of photovoltaic cells responsive to solar radiation electrically interconnected to one another by a plurality of electrical conductors;
   an enclosure supporting said array, said enclosure including a rear cover, a front cover transmissive to solar radiation to which said cells are responsive, and a peripheral seal sealing together in spaced-apart relationship said front and rear covers, said front and rear covers being of sheet-like form having substantially flat surfaces; and
   a plurality of terminals suitable for electrically connecting said array to a load external to said enclosure, each of said terminals penetrating through a portion of said enclosure and being electrically connected to a selected one of said cells by an electrical conductor;
   the improvement wherein at least one of said terminals is tubular in form whereby an elastomer transmissive to said solar radiation to which said cells are responsive may, while fluid, be injected into said enclosure through said at least one terminal to encapsulate said array.

2. Apparatus of claim 1 wherein further said front and rear covers are substantially rectangular in plan and wherein said terminals are situated to penetrate said rear cover in two diagonally opposed corners.

3. Apparatus of claim 1 wherein further said electrical conductors are of a flexible open mesh of a porosity chosen to permit the penetration therethrough of said elastomer, while fluid.

4. Apparatus of any one of claims 1 and 2 wherein further said cells are arranged in an overlapping, shingle-like manner.

5. Apparatus of claim 4 wherein further said electrical conductors are of a flexible open mesh.

6. A method for encapsulating, in an interior region of a protective enclosure, an array of photovoltaic cells situated therein and electrically connectable to a load external to said enclosure through a plurality of tubular conductive terminals, said method comprising the steps of injecting into said interior region of said enclosure through one of said tubular terminals an elastomer in a fluid state, simuntaneously exhausting air from said interior region through a second one of said tubular terminals, and terminating such injection after all of the air has been exhausted from said interior region and said cells have been encapsulated by said elastomer.

7. A solar panel comprising in combination:
   an array of photovoltaic cells responsive to solar radiation electrically interconnected to one another by a plurality of electrical conductors;
   an enclosure supporting said array, said enclosure including a rear cover, a front cover transmissive to solar radiation to which said cells are responsive, and a peripheral seal sealing together in spaced-apart relationship said front and rear covers, said front and rear covers being of sheet-like form having substantially flat surfaces;
   a plurality of terminals suitable for electrically connecting said array to a load external to said enclosure, each of said terminals penetrating through a portions of said enclosure and being electrically connected to the selected one of said cells by an electrical conductor, at least one of said terminals being tubular in form; and an elastomer transmissive to said solar radiation to which said cells are responsive filling said enclosure in encapsulating relation to said cells, said elastomer extending within said at least one tubular terminal.

* * * * *